US005506047A

United States Patent [19]
Hedrick et al.

[11] Patent Number: 5,506,047
[45] Date of Patent: Apr. 9, 1996

[54] ELECTROMAGNETIC INTERFERNCE SHIELDING FILTER

[75] Inventors: Fred G. Hedrick, Ft. Myers, Fla.; Craig D. Lack, Newark, Del.

[73] Assignee: W. L. Gore & Associates, Inc., Newark, Del.

[21] Appl. No.: 91,787

[22] Filed: Jul. 13, 1993

Related U.S. Application Data

[63] Continuation-in-part of Ser. No. 781,435, Oct. 23, 1991, abandoned.

[51] Int. Cl.$^6$ ...................................................... B32B 5/14
[52] U.S. Cl. ................................ 428/307.7; 428/308.4; 428/422
[58] Field of Search .......................... 428/304.4, 307.7, 428/308.4, 422

[56] References Cited

U.S. PATENT DOCUMENTS

| | | |
|---|---|---|
| 3,953,566 | 4/1976 | Gore . |
| 4,187,390 | 2/1980 | Gore . |
| 4,255,384 | 3/1981 | Kitajima et al. . |
| 4,557,957 | 12/1985 | Manniso .................................. 428/36 |
| 4,720,400 | 1/1988 | Manniso . |
| 5,116,650 | 5/1992 | Bowser .................................. 428/34.2 |

FOREIGN PATENT DOCUMENTS

| | | |
|---|---|---|
| 0152632 | 8/1985 | European Pat. Off. . |
| 0256756 | 2/1988 | European Pat. Off. . |
| 9209429 | 6/1992 | WIPO . |

OTHER PUBLICATIONS

Abstract: Research Disclosure Apr. 1989; No. 30027; Electrically Conductive, Breathable, Hydrophobic Membrane.

*Primary Examiner*—Melvyn I. Marquis
*Assistant Examiner*—D. Aylward
*Attorney, Agent, or Firm*—Gary A. Samuels

[57] ABSTRACT

A porous composite material made of porous electrically conductive materials coated with or laminated to porous hydrophobic or oleophobic materials. The porous composite material has excellent electromagnetic radiation shielding properties and resists passage of particles through it while permitting air or other gases to flow through it.

8 Claims, 1 Drawing Sheet

ELECTROMAGNETIC INTERFERNCE SHIELDING FILTER

CROSS REFERENCE TO RELATED APPLICATIONS

This application is a continuation-in-part of application Ser. No. 07/781,435 filed Oct. 23, 1991, abandoned.

FIELD OF THE INVENTION

This invention relates to electromagnetic radiation shielding materials and, more particularly, to porous materials having high electromagnetic radiation shielding characteristics and high particle filtration performance for use in electronic equipment enclosures. Preferably the materials are also hydrophobic, chemical-resistant, and gas-resisant materials.

BACKGROUND OF THE INVENTION

Many shielded electronic equipment enclosures and housings provide internal ventilation, temperature control and ambient pressure equilibration by air circulation through them. Air passage into the enclosures is through electromagnetic radiation shielding devices and air filters located in the enclosure vents.

It is expected of these shielding devices and filters that they prevent, or reduce to acceptable levels, passage of electromagnetic radiation or interference (EMI); and that they also prevent passage of particulate materials, to specified size levels; while minimizing impediments to flow of air through the enclosure. For example, metal honeycomb assemblies are very effective in shielding against EMI, however, they are quite bulky, ranging in thickness from about ½" to several inches depending on the electromagnetic radiation frequency range over which they are providing shielding. Furthermore, the honeycomb assemblies are usually arrays of open tubes that provide no barrier properties to passage of dust, dirt, or other particles through them and, consequently, require that separate filtration units be included in the equipment if prevention of passage of particles into the enclosure is important. In general, for installations in which there is great flexibility in space and weight considerations effective EMI-shielding filter assemblies can be constructed from methods and materials well known in the art.

On the other hand, for installations in small, portable electronic devices such as hand-held nuclear radiation detectors, hip-mounted air samplers, and other electronic sensors and instruments or, in mobile electronic systems such as radio/telephone communication systems, missile guidance and control systems, and the like, in which there are severe constraints on the size and weight of components, there are few suitable materials from which compact, lightweight, effective EMI-shielding air filters capable of operating in a broad range of environments can be constructed.

SUMMARY OF THE INVENTION

This invention provides a lightweight porous material that has high electromagnetic radiation shielding properties; excellent barrier properties to fine liquid and solid particulates; high resistance to wetting and penetration by oils; and excellent air flow characteristics. Preferably the materials will also be resistant to wetting by water and will have high resistance to attack or damage by chemicals. Combination of the preceding stated properties in a single thin material has been heretofore unknown.

The material of the invention can be readily fabricated by conventional means to form compact, space- and weight-saving air vent filters for electronic equipment that protect the equipment from adverse influence or damage by electromagnetic radiation or intrusion by airborne particles, and which can be used in almost any indoor or outdoor environment without loss of effectiveness.

Broadly described, the material of the invention is a porous composite material comprising a porous electrically-conductive material to which is adhered a porous oleophobic material.

More specifically, referring to the drawings, FIG. 1 illustrates an embodiment having a layer of porous electrically-conductive material laminated to an outer protective layer of porous oleophobic material.

FIG. 2 illustrates an embodiment having a porous protective layer laminated to each side of a porous electrically-conductive layer. The porous outer protective layer of the embodiment is a porous oleophobic material.

FIG. 3 illustrates another embodiment of the invention, having a single layer, of porous electrically-conductive material which has been coated with an oleophobic material.

Porous is used herein to describe materials that allow passage of gases, especially air. These are materials that comprise interconnected pores and voids that form passages extending through the thickness of the material. The passageways open on both sides of the material.

DESCRIPTION OF THE PREFERRED EMBODIMENTS OF THE INVENTION

Figure 1:
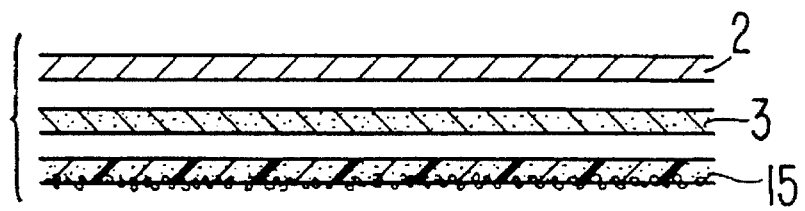
FIG. 1 is an exploded cross-section view of a two-layer embodiment of the invention.

Referring to FIG. 1, two-layer embodiments of the invention comprise a porous layer of electrically conductive material 2 adhered to a porous outer protective layer of porous oleophobic coated material 15 by a porous layer of adhesive 3.

The electrically conductive material 2 may be any porous material having sufficient electrical conductivity and having a structure such that incident electromagnetic radiation presented to it will be substantially reflected, intercepted, or otherwise attenuated. Such electrically conductive materials include woven wire mesh, sintered porous metals, metal sponges, etc. Another electrically-conductive material is film or sheet of porous expanded polytetrafluoroethylene containing electrically-conductive particles. Such a particle-filled sheet or film can be prepared by coagulation of a mixture of electrically-conductive particles and polytetrafluoroethylene particles suspended in an aqueous dispersion and processing the mixture into a porous expanded form as described in U.S. Pat. Nos. 3,953,566 and 4,187,390. Suitable electrically-conductive filler particles include metal particles such as silver, gold, nickel, stainless steels, and the like or, preferably, high conductivity carbon particles.

The materials most preferred for the electrically-conductive layer 2 are porous non-woven sheet, film, or mesh of synthetic polymers. Such porous non-woven sheet, film, or mesh may be prepared from the classes of polymers including, but not limited to, polyamides, polyesters, polyolefins, polyurethanes, fluoropolymers, and the like, by fiber processes known in the art such as spin bonding, felting, paper-making, and the like, or by other pore-forming processes known in the art, for example, foaming, stretching, or expansion processes. The non-woven sheet, film, or mesh are made electrically conductive by application of metals to their surfaces by metallizing processes such as vapor deposition, sputter coating, and the like, or preferably, by electroless chemical deposition processes. U.S. Pat. Nos. 4,557,957 and 4,720,400 describe electroless chemical plating methods suitable for metallizing internal pore surfaces as well as external surfaces of porous expanded polytetrafluoroethylene. The methods described can also be used to plate other porous synthetic polymer film and sheet which, although not as inherently hydrophobic as polytetrafluoroethylene, are substantially resistant to penetration of water and aqueous chemical solutions.

The porous outer protective layer of porous oleophobic coated material 15 forms the outermost layer of the layered material of the invention, serving as a barrier to passage of liquid and solid particulates in the local environment while allowing passage of gases through it, for example, into or out of an equipment enclosure for cooling purposes or pressure equilibration.

The porous outer protective layer can be any material having suitable air flow and filtration characteristics and which is inherently oleophobic or, which can be treated to develop oleophobic properties in it. The material can be a fabric, such as a non-woven, woven, or knit fabric. The material can be made as a paper, for example, a synthetic or natural filter paper or cloth. The material can also be a porous mesh, film or membrane of synthetic polymers including polyamides, polyesters, polyolefins such as polyethylene or polypropylene, polyacrylics, polyvinylidene fluoride, and the like.

Preferred as a gas permeable material for the porous oleophobic outer protective layer 15 is porous polytetrafluoroethylene, most preferably, porous expanded polytetrafluoroethylene membrane or film made as described in U.S. Pat. No. 3,953,566, which has a porous microstructure of nodes interconnected by fibrils. The resulting pores or voids allow for good gas or air flow, provide excellent particle filtration properties, and, due to the high inherent hydrophobicity of polytetrafluoroethylene, resistance to penetration of liquid water or aqueous solutions. Additionally, the porous expanded polytetrafluoroethylene membrane or film imparts excellent chemical resistance and broad temperature range of use to the material of the invention due to the chemical inertness and thermal properties of polytetrafluoroethylene.

The composite EMI-shielding filter material of the invention may be used in environments in which it is exposed to water, oils, lipids, and the like, therefore it is important that resistance to penetration by water, oils, lipids, etc., if not inherent in the components forming the composite material, be developed in them. For example, porous PTFE alone, normally has little oleophobicity, yet when coated with oleophobic materials described herein, is rendered oleophobic. Likewise, other porous components of the composite material of the invention can be made oleophobic by coating them with the oleophobic materials. The resulting coated products exhibit good oleophobic properties while having good gas or air flow through the material, the coated products can be used in applications involving gas flow-through where the coated products need to be resistant to penetration by water, oil, lipid emulsions, and the like. Such applications include use as air vents or filters that protect electronic equipment, used indoors or outdoors, in virtually any industrial, commercial, medical, or automotive environment.

As described in U.S. Pat. No. 5,116,650 (to Bowser), the porous expanded polytetrafluoroethylene and other porous gas permeable materials described above can be coated with an amorphous copolymer of tetrafluoroethylene and perfluoro-2,2-dimethyl-1,3-dioxole to develop oleophobic properties in them. The copolymer is available from the DuPont Company as Teflon® AF 1600 in which the dioxole concentration is about 65 mole percent, and as Teflon® AF 2400 in which the dioxole concentration is about 85 mole percent.

The oleophobic copolymer coating is applied from a dilute solution, for example, a solution of perfluoro-(2-butyltetrahydrofuran) solvent (also known as Fluoroinert®-75, or FC-75, from Dow Chemical Co.) containing copolymer solids in the concentration range 0.01 to 5.0 wt. percent. The solution can be applied to the porous permeable materials by conventional means such as spraying, transfer roll coating, dip coating, brushing, and the like, after which the solvent is dried by any convenient means. The coating coats all the outside surfaces and at least a portion of the interior surfaces of the pores without blocking the pores or excessively reducing the void volume of the porous material to which it is applied.

Another coating material which can be used to develop oleophobic properties in porous expanded polytetrafluoroethylene and other porous gas permeable materials comprises the reaction product of perfluoroalkyl alkyl alcohol compounds with selected diisocyanates.

The preferred alcohols useful in making the compositions of this coating material are of the general formula $$R_f\text{—}(CH_2)_x OH$$

wherein $R_f$ is perfluoroalkyl, linear or branched, of between 3 and 20 carbon atoms, and wherein x is a cardinal number of 1–4. Representative $R_f$ groups include $C_4F_9$—, $C_{20}F_{41}$—,  and the like. A preferred alcohol is a mixture of $F(CF_2)_n(CH_2)_2OH$ where n is from 4 to 18. The diisocyanates used herein are methylene-di(p-phenylene isocyanate) and trans cyclohexylene diisocyanate.

To form the coated products of the invention, the coating composition can be dissolved in a suitable organic solvent, such as an ether or ketone, in an amount of about 1–5% by weight. The concentration in the solvent will depend on the loading desired.

The coating solution is applied by any convenient means to the porous polymeric substrate. It can be spread on, dip coated, or sprayed so as to coat the pore walls but not block them. The solvent is then evaporated by any convenient means, such as heating.

Yet another coating material which can be used to develop oleophobic properties in porous expanded polytetrafluoroethylene and other porous gas permeable materials is an aqueous emulsion of fluoroacrylate particles, manufactured and sold as F-95 Fluoroacrylate emulsion by Imperial Chemical Industries, Ltd.

The adhesive of the porous layer of adhesive 3 may be selected from many well known in the art. The adhesives can be thermoplastic, thermosetting, or reaction curing types, in liquid or solid form, selected from the classes including, but not limited to, polyamides, polyacrylamides, polyesters, polyolefins, polyurethanes, and the like. The adhesive must be applied so that it forms a porous gas permeable layer which minimizes resistance to air flow while adhering the porous outer protective layer 5 to the porous electrically-conductive layer 2. Suitable application means include gravure printing, spray coating, powder coating, and the like.

A preferred adhesive is a thermoplastic polymer in the form of a non-woven web or mesh. The non-woven thermoplastic web or mesh is placed between the porous electrically-conductive layer 2 and the porous oleophobic outer protective layer 15 and, by applying heat and pressure, for example, by a hot-roll and a pinch-roll or by a heated press, the thermoplastic adhesive web is melted and the porous electrically-conductive material layer 2 is adhered to the porous oleophobic material of the outer protective layer 5, thus forming the porous layered material of the invention.

For process and cost considerations it may be desirable to alter the order in which the electroless chemical plating, oleophobic coating, and/or lamination take place. For example, electroless chemical plating of a porous material laminated to an oleophobic outer protective layer can be done after lamination without difficulty and without loss of function. Likewise, oleophobic coatings can be applied to single layers or laminated constructions equally well.

Figure 3:
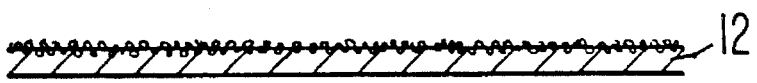
FIG. 3 is a cross-section of a single-layer embodiment of the invention.

By the same token, for applications where an outer protective layer is deemed unnecessary or undesirable, a second embodiment, shown in FIG. 3, of the porous composite material of the invention which comprises a single layer 12 of porous electrically-conductive material coated with an oleophobic material as described above. The porous electrically-conductive material provides the same level of EMI shielding as in the laminated form and, when coated with the amorphous copolymer of tetrafluoroethylene and perfluoro -2,2-dimethyl-1,3-dioxole, the reaction product of perfluoroalkyl alkyl alcohol compounds with selected diisocyanates, or F-95 fluoroacrylate emulsion as described above, exhibits good hydrophobic and oleophobic properties while having good gas or air flow through the material.

The single-layer embodiment of FIG. 3 is particularly useful in applications where very high air flow and good EMI-shielding are paramount, and oleophobicity characteristics and filtration requirements are of lesser importance. For example, a single-layer product of the invention can provide an air flow rate of Frazier No. 1500, EMI-shielding attenuation greater than −40 db, oil repellency, and a barrier to particles 75 micrometers diameter and larger. Such a performance level has not previously been available in a single thin material.

Figure 2:
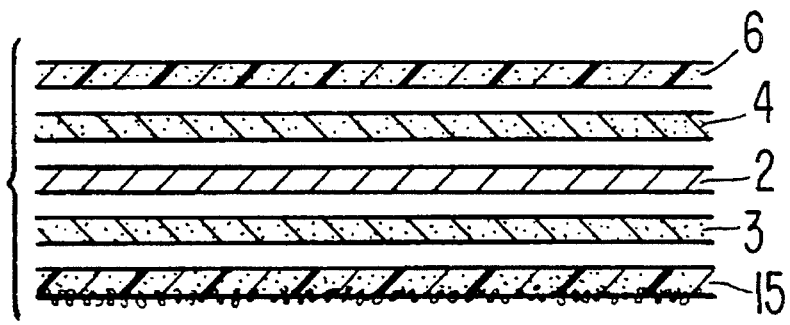
FIG. 2 is an exploded cross-section view of a three-layer embodiment of the invention.

Three-layer embodiments of the invention are shown in FIG. 2. These embodiments comprise a porous layer of electrically-conductive material 2 adhered to a porous outer protective layer of porous oleophobic coated material 15 by a porous layer of adhesive 3, all as specified above in the description of the broadest embodiment of the invention. It further comprises a porous inner protective layer 6 adhered to the inside surface of the electrically-conductive layer 2 by a porous layer of adhesive 4. The porous inner protective layer 6 prevents contact with the porous electrically-conductive material layer 2, thus reducing the likelihood of damage to the porous electrically-conductive layer during assembly, handling, and use. The porous inner protective material layer 6 provides further protection by preventing migration of any particles that may be shed by the porous electrically-conductive material layer 2.

The porous inner protective material layer 6 can be of any material having suitable airflow and filtration characteristics and also having excellent non-linting or non-shedding characteristics. The material can be a fabric or paper as described above with respect to the material of the porous outer protective layer, however, more preferable materials are porous films, membranes, non-woven webs and meshes of synthetic polymers also described above.

Porous polytetrafluoroethylene, preferably porous expanded polytetrafluoroethylene membrane or film made as described in U.S. Pat. No. 3,953,566 is most preferred as the material for the porous inner protective layer 6. In addition to the properties described earlier, the porous expanded polytetrafluoroethylene membrane or film has especially good non-linting and non-shedding characteristics.

Selection, application, and processing of the material of the porous layer of adhesive 4 is as described above with respect to the porous layer of adhesive 3, however, referring to FIG. 2, the materials forming the porous layers of adhesive 3, 4 may be, but are not necessarily, the same. It may be desirable, for process considerations, to use a different material in each porous layer of adhesive, for example, a different adhesive polymer in each layer or an adhesive polymer type having a different melt point in each layer.

TEST PROCEDURES

Air Permeability—Gurley Number Method (Low Flow)

The resistance of samples to air flow was measured by a Gurley densometer (manufactured by W. & L. E. Gurley & Sons) in accordance with Test Standard ASTM D726-58. The results are reported in terms of Gurley-number (also Gurley-seconds) which is the time in seconds for 100 cubic centimeters of air to pass through 1 square inch of a test sample at a pressure drop of 4.88 inches of water.

Air Permeability—Frazier Number Method (High Flow)

Air permeability was measured by clamping a test sample in a gasketed flanged fixture which provided a circular area of approximately 0.785 square inches (1.0 inch diameter) for air flow measurement. The upstream side of the sample fixture was connected to a flow meter in line with a source of dry compressed air. The downstream side of the sample fixture was open to the atmosphere.

Testing was accomplished by applying a pressure of 0.5 inch of water to the upstream side of the sample and recording the flow rate of the air passing through the in-line flowmeter (a ball-float rotameter).

The sample was conditioned at 70° F. and 65% relative humidity for at least 4 hours prior to testing.

Results are reported in terms of Frazier Number which is air flow in cubic feet/minute/square foot of sample at 0.5 inches water pressure.

Oil Repellency

The resistance of samples to wetting by oily liquids was tested by challenging them with drops of test liquids as specified in AATCC Test Method 118-1989. The test liquids are a series of eight liquid hydrocarbons of different surface tensions, small drops of which are placed on the sample surface and observed for wetting. The Oil Repellency Rating is the highest numbered test liquid which does not wet the test surface. Testing was done according to the test method except that samples smaller than 8 in.× 8 in. were used and the samples were not necessarily conditioned as specified prior to testing.

Electromagnetic Interference Shielding Effectiveness

EMI Shielding Effectiveness of test samples was measured according to ASTM Standard Test Method D4935-89 for measuring the Electromagnetic Shielding Effectiveness of Planar Materials; modified for use in measuring in the frequency range 1 to 18 Gigahertz (GHz).

Shielding Effectiveness (SE) is reported in decibels (db) of attenuation.

Filtration Efficiency Test—AC Fine Dust Challenge

This test measures filtration efficiencies of porous media using an Industrial Filtration Panel Tester developed by W. L. Gore & Associates, Inc.. The test consists of challenging a porous sample of known area by flowing through it a stream of air carrying a dust of known composition at controlled flow rate and velocity as specified below:

| Dust Loading: | 1.6 grains/cubic foot |
|---|---|
| Theoretical Dust Feed: | 1.0 grams/minute |
| Sample Area: | 16 square inches |
| Air Flow Rate: | 10 cubic feet/minute |
| Air Velocity: | 90 feet/minute |
| Test Duration: | 7.5 minutes |

The dust used in this test is known as AC Fine Dust, and is commercially available for use as a standard filtration challenge dust. The dust has the following nominal particle size distribution:

38% less than or equal to 5.5 micrometers
54% less than or equal to 11 micrometers
71% less than or equal to 22 micrometers
89% less than or equal to 44 micrometers
100% less than or equal to 176 micrometers Filtration efficiency is calculated as follows:

Filtration Efficiency=[A/(A+B)]×100 where
 A=Grams of dust captured upstream of the sample (including that retained on the sample)
 B=Grams of dust captured downstream of the sample (i.e. dust which passed through the sample)

EXAMPLES

EXAMPLE 1

A layered porous material of the invention having an oleophobic outer protective layer was prepared as follows:

A 0.003 inch thick porous expanded polytetrafluoroethylene membrane was coated with Teflon® AF 1600 Amorphous Fluoropolymer to make it oleophobic. The membrane was immersed in a bath containing a solution of 0.5% Teflon AF 1600 in FC-75 solvent after which it was oven-dried to remove the solvent. The membrane had an Oil Repellency Rating of 0 before coating and 6 after coating.

The oleophobic porous expanded polytetrafluoroethylene was laminated to a section of the electrically-conductive Reemay 2033 polyester fiber web described in Example 2 with Sharnet 4200 adhesive as described in Example 2.

The finished layered material of the invention was tested and was found to have Air Permeability of 36 Gurley-seconds, Oil Repellency Rating of 4, and EMI Shielding Effectiveness of −85 decibels.

EXAMPLE 2

A layered porous material of the invention having an oleophobic coating was prepared as follows:

Porous spun-bonded polyester fiber web (Reemay #2033) was laminated to the oleophobic porous expanded polytetrafluoroethylene membrane described in Example 1 above. Lamination of the layers was effected using Sharnet 4200 adhesive with heat and pressure applied by passing them through the nip of a hot-roll and a pinch-roll.

The spun-bonded polyester web layer was then selectively made electrically-conductive by electroless chemical plating it with a first layer of copper and a second layer of nickel.

The finished layered material of the invention was tested and found to have Air Permeability of 23 Gurley-seconds, Oil Repellency Rating of 3, and EMI Shielding Effectiveness of −75 decibels.

EXAMPLE 3

A single-layer porous material of the invention having an oleophobic coating was prepared as follows:

A 200×200 woven mesh of polyester monofilament (Type PMX-225, manufactured by Monsanto Co.) was used. The polyester monofilament had a diameter of 1.04 micrometers, and the woven mesh had a thickness of 140 micrometers and a pore volume of 55 percent.

The woven polyester mesh was made electrically-conductive by electroless chemical plating it with a first layer of copper and a second layer of nickel.

The electrically-conductive woven mesh was coated with Teflon® AF 1600 to make it oleophobic. The woven mesh was immersed in a solution of 0.5% Teflon AF 1600 in FC-75 solvent, shaken to remove excess liquid, and oven-dried to remove the solvent.

The finished material was tested and found to have Air Permeability of Frazier No.—1300 and EMI Shielding Effectiveness in the range −55 db to −65 db in the frequency range 10 MHz to 4.5 GHz.

EXAMPLE 4

A single-layer porous material of the invention having an oleophobic coating was prepared as follows:

A non-woven polyester fiber web, Reemay #2033, manufactured by Reemay, Inc., was used. The non-woven polyester web was about 0.015–0.020 inches thick.

The non-woven polyester fiber web was made electrically-conductive by electroless chemical plating the web with a first layer of copper and a second layer of nickel.

The electrically-conductive non-woven polyester fiber web was coated with Teflon AF 1600 to make it oleophobic. The 0.5% solution of Teflon AF 1600 in FC-75 solvent was applied by spray-coating to the non-woven polyester web, after which the web was oven-dried to remove the solvent.

The finished material was tested and found to have Air Permeability of Frazier No.—about 600, an oil-rating of 5, and EMI Shielding Effectiveness in the range −80 db to −95 db in the frequency range 100 MHz to 18 GHz.

EXAMPLE 5

A single-layer porous material of the invention having an oleophobic coating was prepared as described in Example 4, except that the porous material was coated with F-95 fluoroacrylate emulsion to make it oleophobic.

The porous material was immersed in an aqueous emulsion containing 28 percent F-95 fluoroacrylate particles, shaken to remove excess liquid, and oven-dried to remove the solvent. The finished material was tested and found to have Air Permeability of Frazier No.—about 600, an oil-rating of 6, and EMI Shielding Effectiveness in the range −80 db to −95 db in the frequency range 100 MHz to 18 GHz.

EXAMPLE 6

A single-layer porous material of the invention having an oleophobic coating was prepared as described in Example 4, except that the porous material was coated with the reaction product of a perfluoroalkyl alkyl alcohol compound with a diisocyanate to make it oleophobic.

The oleophobic coating was prepared by dissolving the oleophobic reaction product in tetrahydrofuran to form a solution having a concentration of reaction product of about 3 percent. The porous material was immersed in the solution, shaken to remove excess liquid, and oven-dried to remove the solvent.

The finished material was tested and found to have Air Permeability of Frazier No.—about 600, an oil-rating of 6, and EMI Shielding Effectiveness in the range –80 db to –95 db in the frequency range 100 MHz to 18 GHz.

We claim:

1. A composite material for an electromagnetic interference (EMI) shielding filter comprising a porous electrically-conductive material coated with an oleophobic coating, wherein said oleophobic coating is selected from the group consisting of
   (a) an amorphous copolymer of tetrafluoroethylene and perfluoro-2,2-dimethyl-1,3-dioxole,
   (b) a reaction product of a perfluoroalkyl alkyl alcohol compound with a diisocyanate, and
   (c) an emulsion of fluoroacrylate particles; and wherein said composite material has an EMI shielding effectiveness of –40 db or greater in the frequency range 10 Mhz to 18 GHz, an air flow rate of 100 or greater Frazier Number, and an oil repellency rating of 4 or greater.

2. The composite material for an electromagnetic interference shielding filter as recited in claim 1 wherein the porous electrically-conductive material is a metallized porous synthetic polymer material.

3. The composite material for an electromagnetic interference shielding filter as recited in claim 2 wherein the metallized porous synthetic polymer material is a metallized porous non-woven polyester web.

4. The composite material for an electromagnetic interference shielding filter as recited in claim 3 wherein the metallized porous synthetic polymer material is a metallized porous woven polyester mesh.

5. The composite material for an electromagnetic interference shielding filter as recited in claim 4 wherein the metallized porous synthetic polymer material is metallized porous expanded polytetrafluoroethylene.

6. The composite material for an electromagnetic interference shielding filter as recited in claim 1 wherein the porous electrically-conductive material is a porous metal mesh.

7. The composite material for an electromagnetic interference shielding filter as recited in claim 1 wherein said composite material has an air flow rate of 500 or greater Frazier Number.

8. The composite material for an electromagnetic interference shielding filter as recited in claim 7 wherein said composite material has an air flow rate of 1000 or greater Frazier Number.

* * * * *